United States Patent
Charnvanichborikarn et al.

(10) Patent No.: US 12,381,088 B2
(45) Date of Patent: Aug. 5, 2025

(54) METHOD FOR PRECISION OXIDATION CONTROL BY ION IMPLANTATION

(71) Applicant: Applied Materials, Inc., Santa Clara, CA (US)

(72) Inventors: Supakit Charnvanichborikarn, Gloucester, MA (US); Cao-Minh Vincent Lu, Grenoble (FR); Ana Cristina Gomez Herrero, Grenoble (FR); Hans-Joachim Ludwig Gossmann, Summit, NJ (US); Wei Zou, Lexington, MA (US); Andrew Michael Waite, Beverly, MA (US)

(73) Assignee: Applied Materials, Inc., Santa Clara, CA (US)

( * ) Notice: Subject to any disclaimer, the term of this patent is extended or adjusted under 35 U.S.C. 154(b) by 442 days.

(21) Appl. No.: 18/084,670

(22) Filed: Dec. 20, 2022

(65) Prior Publication Data

US 2024/0203743 A1   Jun. 20, 2024

(51) Int. Cl.
*H01L 21/302* (2006.01)
*C23C 14/04* (2006.01)
*C23C 14/48* (2006.01)
*H01J 37/304* (2006.01)
*H01J 37/317* (2006.01)
*H01L 21/02* (2006.01)
*H01L 21/266* (2006.01)
*H01L 21/311* (2006.01)

(52) U.S. Cl.
CPC .......... *H01L 21/302* (2013.01); *C23C 14/042* (2013.01); *C23C 14/48* (2013.01); *H01J 37/304* (2013.01); *H01J 37/3171* (2013.01); *H01L 21/0223* (2013.01); *H01L 21/266* (2013.01); *H01L 21/31111* (2013.01)

(58) Field of Classification Search
None
See application file for complete search history.

(56) References Cited

U.S. PATENT DOCUMENTS

2012/0061682 A1*  3/2012  Yamamoto ........... H10D 62/153
                                                           257/77

FOREIGN PATENT DOCUMENTS

KR           20140083736 A   *   7/2014

OTHER PUBLICATIONS

KR-20140083736-A Machine Translation (Year: 2014).*
(Continued)

*Primary Examiner* — Erik Kielin
(74) *Attorney, Agent, or Firm* — KDW Firm, PLLC

(57) ABSTRACT

A method of processing a semiconductor substrate, including performing a first ion implantation process on the substrate, wherein a first ion beam formed of an ionized first dopant species is directed at a top surface of the substrate and is blocked from a first portion of the substrate while being allowed to implant a second portion of the substrate, and performing a second ion implantation process on the substrate, wherein a second ion beam formed of an ionized second dopant species is directed at the top surface of the substrate and is blocked from the first portion of the substrate while being allowed to implant the second portion of the substrate, wherein an effect of the second ion implantation process on an oxidation rate of the second portion counteracts an effect of the first ion implantation process on the oxidation rate of the second portion.

12 Claims, 6 Drawing Sheets

(56) References Cited

OTHER PUBLICATIONS

K. Tanahashi, M. Moriya, Y. Kida, S. Utsunomiya, T. Fukuda, K. Shirasawa, and H. Takato, "Impact of Post-Implantation Annealing Conditions on Electrical Characteristics of a Phosphorus-Implanted Emitter Crystalline Silicon Solar Cell," IEEE J. Photovoltaics vol. 7, No. 3, May 2017, pp. 741-746.

A. Akasaka, K. Horie, G. Mitarai, Y. Hirose, K. Nomura, and H. Nishiumi, Ion Implantation in Semiconductors, "SB +—Implanted Buried Layer Beneath Thick Oxide Applied for Veri'ical FET", 1976, edited by F. Chernow. J.A. Borders, and D.K. Brice (Plenum, New York, 1977), pp. 535-536.

K. Nomura, Y. Hirose, Y. Akasaka, K. Horie, and S. Kawazu, Ion Implantation in Semiconductors, "Enhanced Oxidation of Silicon by Ion Implantation and Its Novel Applications", edited by S. Namba (Plenum, New York, 1975), pp. 681-682.

R. Kumar, M.S. Yadav, K. Kishore, K. Sambhawam, S. Goyal, D.N. Singh, and P.J. George, "Impact of dose and energy of argon (40Ar+) and fluorine (19F+) ion implantation on uniformity of silicon oxidation", Vacuum 81, (2006), pp. 260-264.

D. Skarlatos, C. Tsamis, and D. Tsoukalas, "Oxidation of nitrogen-implanted silicon: Energy dependence of oxide growth and defect characterization of the silicon substrate", J. Appl. Phys. 93, (2003), https://doi.org/10.1063/1.1535260, pp. 1832-1838.

\* cited by examiner

METHOD FOR PRECISION OXIDATION CONTROL BY ION IMPLANTATION

FIELD OF THE DISCLOSURE

Embodiments of the present disclosure relate to the manufacture of semiconductor devices, and more particularly, to methods for precisely controlling the oxidation of semiconductor substrates.

BACKGROUND OF THE DISCLOSURE

Ion implantation is a standard technique for introducing conductivity-altering impurities into a workpiece such as a wafer or other substrate. A desired impurity material is ionized in an ion source, the ions are accelerated to form an ion beam of prescribed energy, and the ion beam is directed at the surface of the workpiece. The energetic ions in the beam penetrate into the bulk of the workpiece material and are embedded into the crystalline lattice of the workpiece material to form a region of desired conductivity.

During a typical ion implantation process, a mask may first be applied to a workpiece to facilitate implantation of a designated area of the workpiece while shielding surrounding areas from implantation. The mask may then be removed, and the workpiece may be subjected to an oxidation process to activate or segregate the implanted ions. The oxide may then be removed, and an epitaxial layer may be applied to the workpiece.

The above-described process is associated with certain shortcomings. For example, numerous factors can cause non-uniform oxidation of a workpiece. Such factors include variations in crystallographic orientation, mechanical stress, impurities, surface conditions, oxidizing ambient conditions, and temperature. Additionally, an implanted portion of a workpiece may be more or less susceptible to oxidation than an unimplanted portion. Those portions of a workpiece more susceptible to oxidation will oxidize at a faster rate and to a greater depth than those portions less susceptible to oxidation. Thus, after the oxide is removed from an implanted and oxidized workpiece, the workpiece may be left with an uneven surface. Unevenness in the surface of a workpiece can lead to downstream process integration issues, such as overlay errors and defects or dislocations in an epitaxial layer. These types of errors and defects can be detrimental to the performance and reliability of semiconductor devices, especially as devices become smaller and the tolerance for errors and defects is reduced.

With respect to these and other considerations the present disclosure is provided.

SUMMARY

This Summary is provided to introduce a selection of concepts in a simplified form further described below in the Detailed Description. This Summary is not intended to identify key features or essential features of the claimed subject matter, nor is the summary intended as an aid in determining the scope of the claimed subject matter.

A method of processing a semiconductor substrate in accordance with the present disclosure includes performing a first ion implantation process on the semiconductor substrate, wherein a first ion beam formed of an ionized first dopant species is directed at a top surface of the semiconductor substrate and wherein a mask disposed on the top surface shields a first portion of the semiconductor substrate from the first ion beam while allowing the first ion beam to impinge upon and implant a second portion of the semiconductor substrate, and performing a second ion implantation process on the semiconductor substrate, wherein a second ion beam formed of an ionized second dopant species is directed at the top surface of the semiconductor substrate and wherein the mask shields the first portion of the semiconductor substrate from the second ion beam while allowing the second ion beam to impinge upon and implant the second portion of the semiconductor substrate, wherein an effect of the second ion implantation process on an oxidation rate of the second portion counteracts an effect of the first ion implantation process on the oxidation rate of the second portion.

Another method of processing a semiconductor substrate in accordance with the present disclosure includes performing a first ion implantation process on the semiconductor substrate, wherein a first ion beam formed of an ionized first dopant species is directed at a top surface of the semiconductor substrate and wherein a mask disposed on the top surface shields a first portion of the semiconductor substrate from the first ion beam while allowing the first ion beam to impinge upon and implant a second portion of the semiconductor substrate, removing the mask from the top surface of the semiconductor substrate, performing a second ion implantation process on the semiconductor substrate, wherein a second ion beam formed of an ionized second dopant species is directed at the top surface of the semiconductor substrate, including the first portion and the second portion, wherein an effect of the second ion implantation process on an oxidation rate of the second portion counteracts an effect of the first ion implantation process on the oxidation rate of the second portion, removing the mask from the top surface of the semiconductor substrate, performing an oxidation process on the semiconductor substrate, wherein a layer of oxide having a uniform thickness and uniform height is formed on the first and second portions of the semiconductor substrate, removing the layer of oxide from the semiconductor substrate, whereafter the semiconductor substrate is left with a planar surface extending across the first and second portions of the semiconductor substrate, and forming an epitaxial layer on the semiconductor substrate, wherein the epitaxial layer has a uniform thickness and uniform height extending across the first and second portions of the semiconductor substrate.

Another method of processing a semiconductor substrate in accordance with the present disclosure includes performing a first ion implantation process on the semiconductor substrate, wherein a first ion beam formed of an ionized first dopant species is directed at a top surface of the semiconductor substrate and wherein a mask disposed on the top surface shields a first portion of the semiconductor substrate from the first ion beam while allowing the first ion beam to impinge upon and implant a second portion of the semiconductor substrate, and performing a second ion implantation process on the semiconductor substrate, wherein a second ion beam formed of an ionized second dopant species is directed at the top surface of the semiconductor substrate and wherein an effect of the second ion implantation process on an oxidation rate of the semiconductor substrate dominates an effect of the first ion implantation process on the oxidation rate of the semiconductor substrate.

BRIEF DESCRIPTION OF THE DRAWINGS

By way of example, various embodiments of the disclosed techniques will now be described with reference to the accompanying drawings, wherein.

DETAILED DESCRIPTION

Figure 1A:
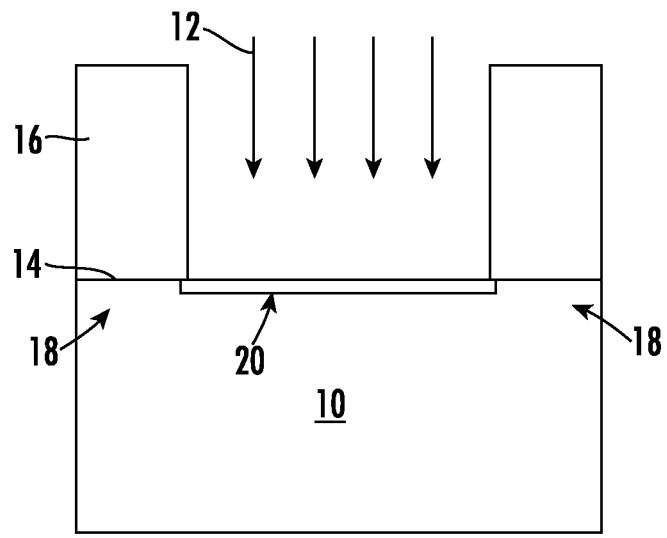
FIGS. 1A-1F are a series of cross-sectional views illustrating a method of producing a semiconductor device having a substrate with good surface evenness after removal of an oxide layer and application of an epitaxial layer in accordance with exemplary embodiments of the present disclosure.

The present embodiments will now be described more fully hereinafter with reference to the accompanying drawings, wherein some exemplary embodiments are shown. The subject matter of the present disclosure may be embodied in many different forms and are not to be construed as limited to the embodiments set forth herein. These embodiments are provided so this disclosure will be thorough and complete, and will fully convey the scope of the subject matter to those skilled in the art. In the drawings, like numbers refer to like elements throughout.

As used herein, an element or operation recited in the singular and proceeded with the word "a" or "an" are understood as possibly including plural elements or operations, except as otherwise indicated. Furthermore, various embodiments herein have been described in the context of one or more elements or components. An element or component may comprise any structure arranged to perform certain operations. Although an embodiment may be described with a limited number of elements in a certain topology by way of example, the embodiment may include more or less elements in alternate topologies as desired for a given implementation. Note any reference to "one embodiment" or "an embodiment" means a particular feature, structure, or characteristic described in connection with the embodiment is included in at least one embodiment. The appearances of the phrases "in one embodiment," "in some embodiments," and "in various embodiments" in various places in the specification are not necessarily all referring to the same embodiment.

The present embodiments provide novel techniques for facilitating precise control of oxidation during the manufacture of semiconductor devices (e.g., solar cells, vertical power field effect transistors, etc.), and in particular mitigating variations in the post-implant oxidation rate of a semiconductor substrate to minimize surface unevenness after oxide removal.

Referring to FIGS. 1A-1F, a series of cross-sectional views illustrating an exemplary process for producing a semiconductor device having a substrate with good surface evenness after removal of an oxide layer and application of an epitaxial layer is shown. Referring to FIG. 2, a flow diagram summarizing the exemplary processes illustrated in FIGS. 1A-1F is provided. For the sake of convenience and clarity, terms such as "top," "bottom," "upper," "lower," "vertical," "horizontal," "lateral," and "longitudinal," may be used herein to describe the relative position and orientation of various structures and features, all with respect to the geometry and orientation of the structures and features as they appear in the views shown in FIGS. 1A-1F. Said terminology is not intended to be limiting and includes the words specifically mentioned, derivatives thereof, and words of similar import.

Figure 2:
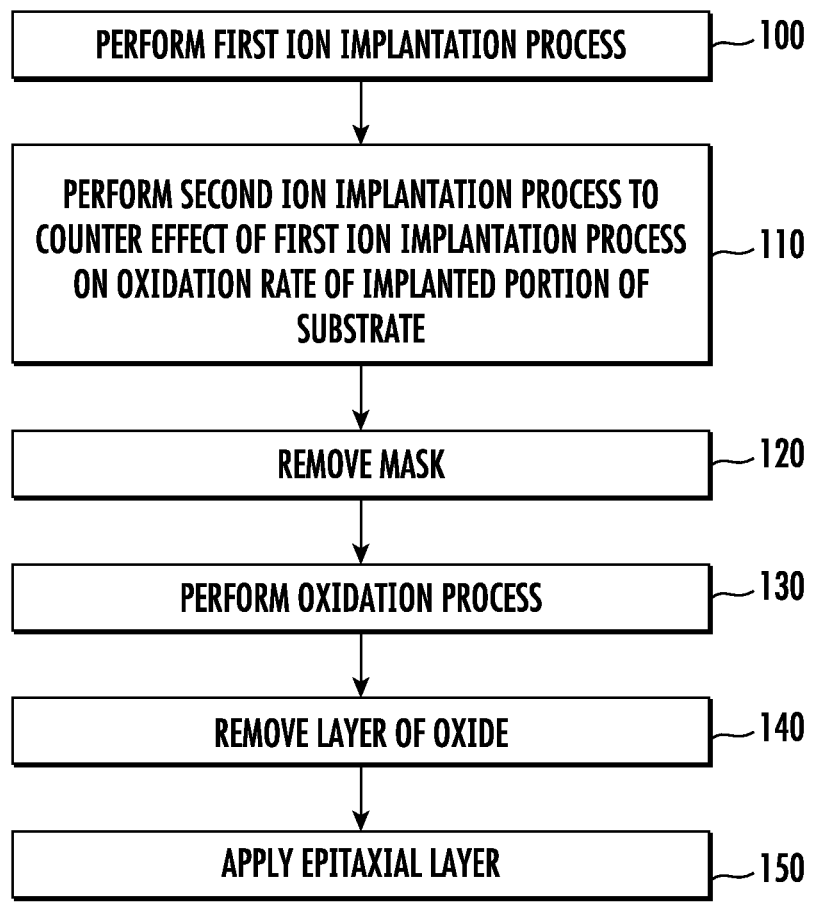
FIG. 2 is a flow diagram summarizing the processes shown in FIGS. 1A-1F.

Referring to FIG. 1A and block 100 in FIG. 2, a first ion implantation process (also referred to as a "baseline implant") may be performed on a semiconductor substrate 10 (hereinafter "the substrate 10"), wherein an ion beam 12 formed of an ionized first dopant species may be directed at a top surface 14 of the substrate 10. The substrate 10 may be formed of any suitable semiconductor material, including, and not limited to, silicon (e.g., crystalline silicon), germanium, silicon carbide, gallium arsenide, gallium nitride, etc. In various examples, the dopant species may be one or more of germanium, phosphorus, arsenic, boron, gallium, antimony, etc. The present disclosure is not limited in this regard. A mask 16 may be disposed on the top surface 14 and may shield a first portion 18 (hereinafter also referred to as "the unimplanted portion 18") of the substrate 10 from the ion beam 12 while allowing the ion beam 12 to impinge upon, and thus implant, a second portion 20 (hereinafter also referred to as "the implanted portion 20") of the substrate 10.

Depending on the dopant species used in the first ion implantation process, the implanted portion 20 of the substrate 10 may be made more or less susceptible to oxidation relative to the unimplanted portion 18 of the substrate 10. For example, dopant species including, and not limited to, antimony, phosphorus, tin, argon, and fluorine may make the implanted portion 20 of the substrate 10 more susceptible to oxidation relative to the unimplanted portion 18, and dopant species including, and not limited to, nitrogen may make the implanted portion 20 of the substrate 10 less susceptible to oxidation relative to the unimplanted portion 18.

Figure 1B:
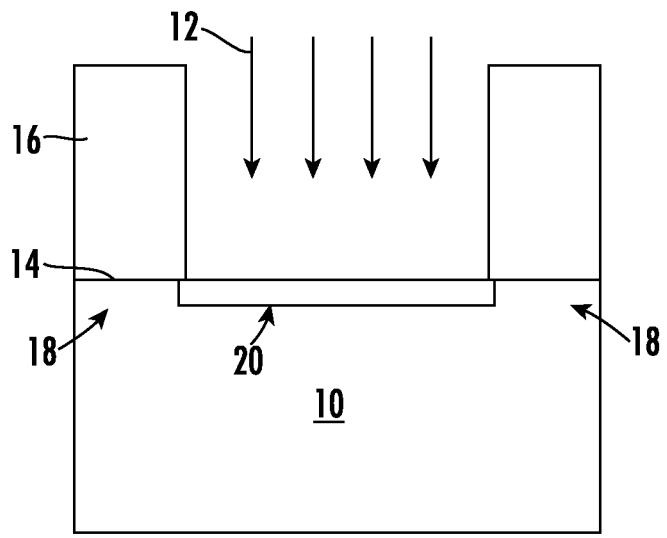

Referring to FIG. 1B and block 110 in FIG. 2, a second ion implantation process (also referred to as a "co-implant") may be performed on the semiconductor substrate 10, wherein an ion beam 22 formed of an ionized second dopant species may be directed at the top surface 14 of the substrate 10. As in the first ion implantation process, the mask 16 may shield the unimplanted portion 18 of the substrate 10 from the ion beam 22 while allowing the ion beam 22 to impinge upon, and thus implant, the implanted portion 20 of the substrate 10.

The dopant species used in the second ion implantation process may be selected to counteract the effect of the first ion implantation process on the substrate's susceptibility to oxidation. For example, if the first ion implantation process increased the susceptibility of the implanted portion 20 of the substrate 10 to oxidation relative to the unimplanted portion 18 (e.g., if the first dopant species was one of antimony, phosphorus, tin, argon, or fluorine), the second dopant species may be selected to retard the susceptibility of the implanted portion 20. For example, the dopant species selected for the second ion implantation species may be nitrogen. Conversely, if the first ion implantation process decreased the susceptibility of the implanted portion 20 of the substrate 10 to oxidation relative to the unimplanted portion 18 (e.g., if the first dopant species was nitrogen), the second dopant species may be selected to retard the susceptibility of the implanted portion 20. For example, the dopant species selected for the second ion implantation species may be one of antimony, phosphorus, tin, argon, or fluorine.

The magnitude of the effect of the second ion implantation process on the retardation or enhancement of the oxidation rate of the implanted portion 20 of the substrate 10 may be controlled by varying the dose and/or the implant energy of the second ion implantation process. A greater dose and/or implant energy may result in greater retardation or enhancement of the oxidation rate, and a lesser dose and/or implant energy may result in lesser retardation or enhancement of the oxidation rate. Such factors may be varied based on a calculated or measured effect of the first ion implantation process on the oxidation rate of the implanted portion 20, with the aim of making the oxidation rate of the implanted portion 20 equal to (or nearly equal to) the oxidation rate of the unimplanted portion 18.

Figure 1C:
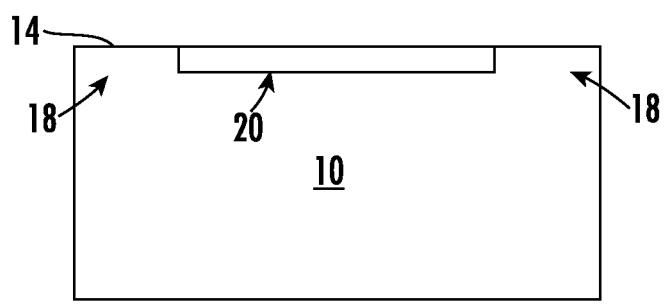

Referring to FIG. 1C and block 120 in FIG. 2, the mask 16 may be removed from the top surface 14 of the substrate 10. For example, in various embodiments, the mask 16 may be etched or dissolved using any suitable technique known in the art.

Figure 1D:
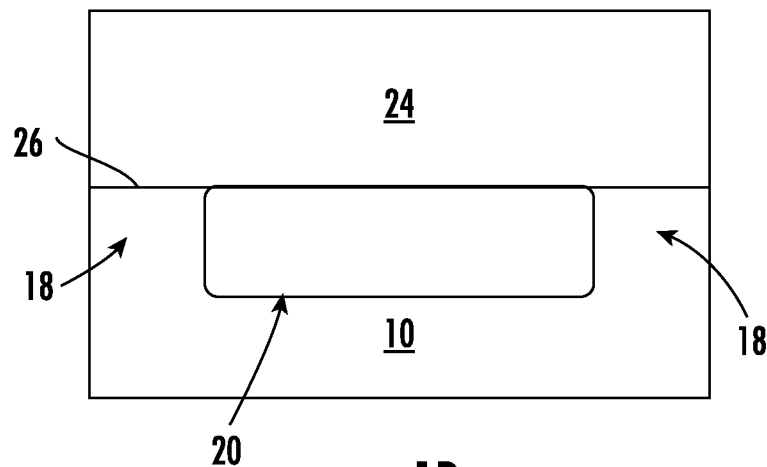

Referring to FIG. 1D and block 130 in FIG. 2, a thermal oxidation process may be performed on the substrate 10, wherein a layer of oxide 24 (e.g., $SiO_2$) is formed atop the substrate 10 and wherein the implanted dopant species in the implanted portion 20 of the substrate 10 is diffused and segregated into the substrate 10. The thermal oxidation process may be wet (using water as a reactant) or dry (using dry oxygen as a reactant). The present disclosure is not limited in this regard. Owing to the second ion implantation process described above, wherein the oxidation rate of the implanted portion 20 was made equal to (or nearly equal to) the oxidation rate of the unimplanted portion 18, the layer of oxide 24 may grow at a generally uniform rate and may have a generally uniform thickness and uniform height across the substrate 10. Particularly, the layer of oxide 24 may have a generally planar floor 26 extending across the implanted portion 20 and the unimplanted portion 18.

Figure 1E:
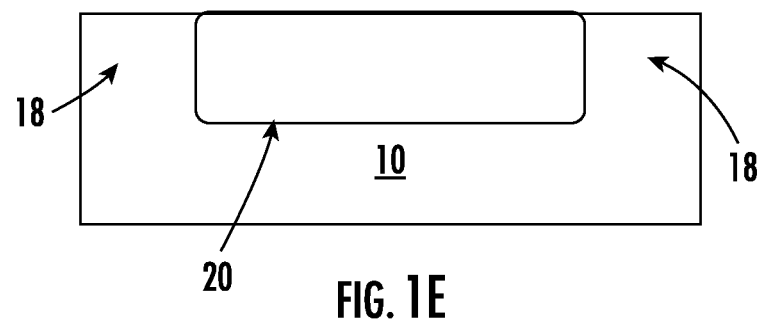

Referring to FIG. 1E and block 140 in FIG. 2, the layer of oxide 24 may be removed from the substrate 10. This may be accomplished via wet etching, dissolving using an acid solution (e.g., dilute hydrofluoric acid solution), or any other suitable technique known in the art. The present disclosure is not limited in this regard. Since the layer of oxide 24 has a uniform thickness and generally planar floor 26 (see FIG. 1D) as described above, removal of the layer of oxide 24 may leave the substrate 10 with a generally uniform, planar surface devoid of trenches, cavities, undulations, or significant unevenness.

Figure 1F:
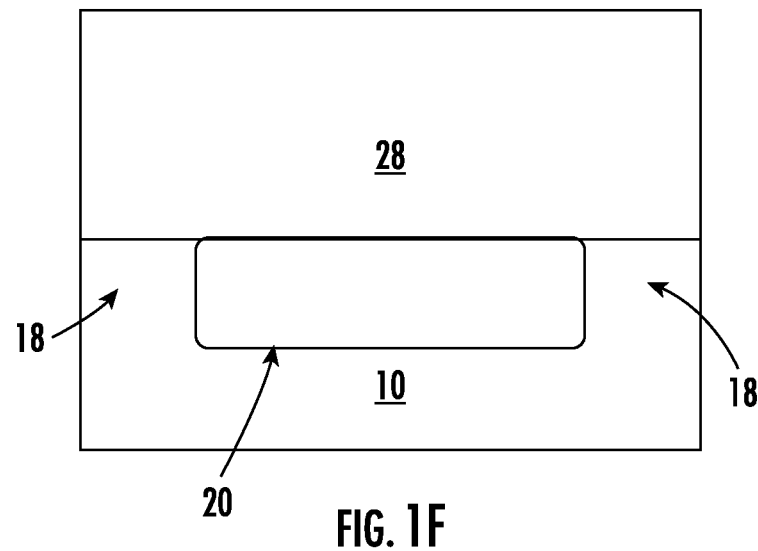

Referring to FIG. 1F and block 150 in FIG. 2, an epitaxial layer 28 may be deposited on the substrate 10 and may cover both the implanted portion 20 and the unimplanted portion 18. In various embodiments, the epitaxial layer 28 may be applied via chemical vapor deposition and may provide the substrate 10 with a crystalline overlayer having a well-defined orientation relative to the crystalline structure of the substrate 10. Since the substrate 10 has a generally planar surface as described above, the deposited epitaxial layer 28 may have a generally uniform thickness, a generally uniform height, and a generally planar top surface.

The above-described method may provide numerous benefits in the art. For example, the above-described method may produce a semiconductor substrate with enhanced surface evenness and uniformity. Additionally, the method may result in fewer downstream process integration issues, such as overlay errors and defects or dislocations in the epitaxial layer 28, relative to processes using conventional implantation and oxidation techniques. The performance and reliability of resulting semiconductor devices may thus be improved.

Referring to FIGS. 3A-3F, a series of cross-sectional views illustrating another exemplary process for producing a semiconductor device having a substrate with good surface evenness after removal of an oxide layer and application of an epitaxial layer is shown. Referring to FIG. 4, a flow diagram summarizing the exemplary processes illustrated in FIGS. 3A-3F is provided. As described in greater detail below, the process set forth in FIGS. 3A-3F and 4 may be appropriate in situations where the effect of a first ion implantation process (i.e., a baseline implant) on the oxidation rate of a substrate may be dominated by the effect of a second ion implantation process (i.e., a co-implant) on the oxidation rate of the substrate. Said another way, the effect of the second ion implantation process on the susceptibility of the substrate to oxidation may be so strong as to nullify or make insignificant any effect the first ion implantation process may have on the susceptibility of the substrate to oxidation.

Again, for the sake of convenience and clarity, terms such as "top," "bottom," "upper," "lower," "vertical," "horizontal," "lateral," and "longitudinal," may be used herein to describe the relative position and orientation of various structures and features, all with respect to the geometry and orientation of the structures and features as they appear in the views shown in FIGS. 3A-3F. Said terminology is not intended to be limiting and includes the words specifically mentioned, derivatives thereof, and words of similar import.

Figure 3A:
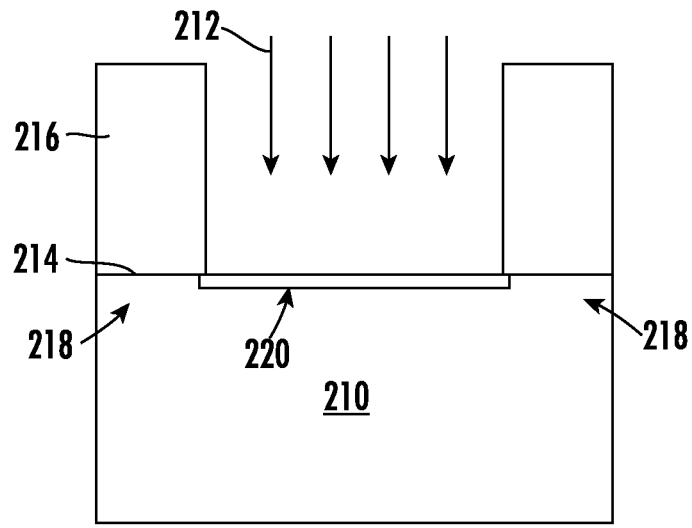
FIGS. 3A-3F are a series of cross-sectional views illustrating another method of producing a semiconductor device having a substrate with good surface evenness after removal of an oxide layer and application of an epitaxial layer in accordance with exemplary embodiments of the present disclosure.
Figure 4:
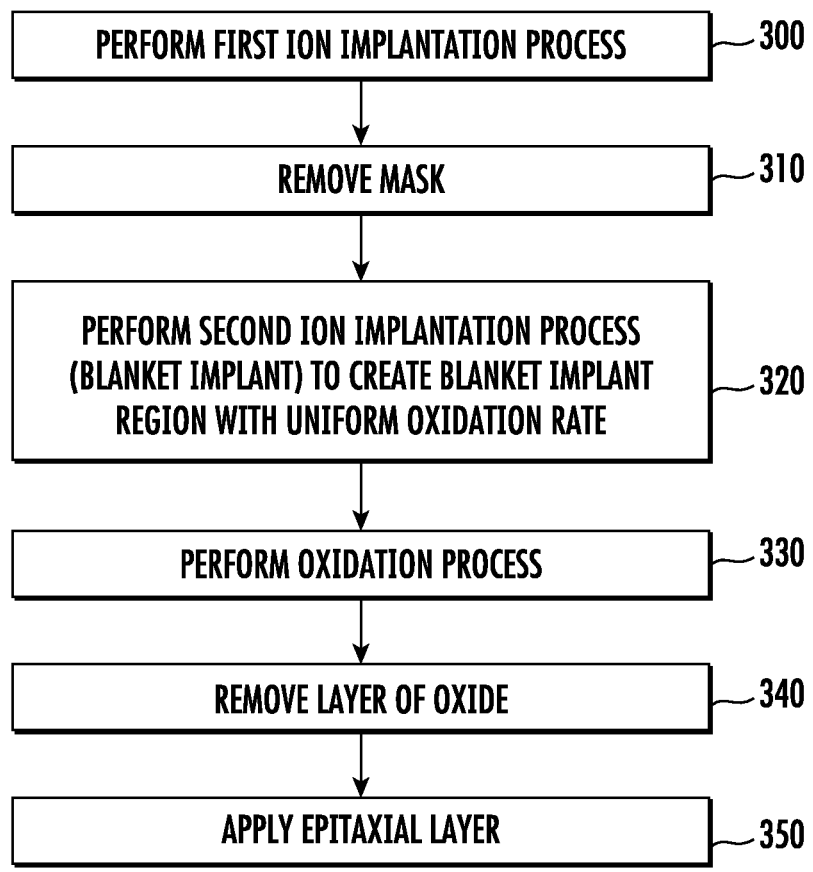
FIG. 4 is a flow diagram summarizing the processes shown in FIGS. 3A-3F.

Referring to FIG. 3A and block 300 in FIG. 4, a first ion implantation process (also referred to as a "baseline implant") may be performed on a semiconductor substrate 210 (hereinafter "the substrate 210"), wherein an ion beam 212 formed of an ionized first dopant species may be directed at a top surface 214 of the substrate 210. The substrate 210 may be formed of any suitable semiconductor material, including, and not limited to, silicon (e.g., crystalline silicon), germanium, silicon carbide, gallium arsenide, gallium nitride, etc. In various examples, the dopant species may be one or more of germanium, phosphorus, arsenic, boron, gallium, antimony, etc. The present disclosure is not limited in this regard. A mask 216 may be disposed on the top surface 214 and may shield a first portion 218 (hereinafter also referred to as "the unimplanted portion 218") of the substrate 210 from the ion beam 212 while allowing the ion beam 212 to impinge upon, and thus implant, a second portion 220 (hereinafter also referred to as "the implanted portion 220") of the substrate 210.

Depending on the dopant species used in the first ion implantation process, the implanted portion 220 of the substrate 210 may be made more or less susceptible to oxidation relative to the unimplanted portion 218 of the substrate 210. For example, dopant species including, and not limited to, antimony, phosphorus, tin, argon, and fluorine may make the implanted portion 220 of the substrate 210 more susceptible to oxidation relative to the unimplanted portion 218, and dopant species including, and not limited to, nitrogen may make the implanted portion 220 of the substrate 210 less susceptible to oxidation relative to the unimplanted portion 218.

Figure 3B:
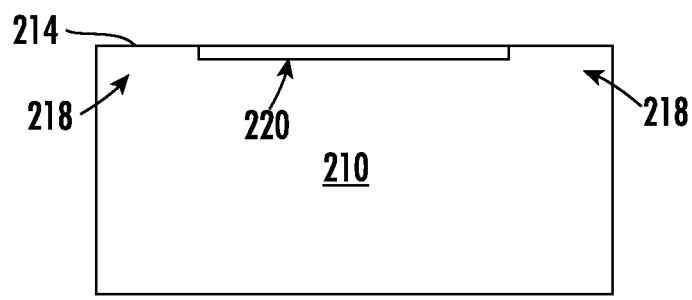

Referring to FIG. 3B and block 310 in FIG. 4, the mask 216 may be removed from the top surface 214 of the substrate 210. For example, in various embodiments, the mask 216 may be etched or dissolved using any suitable technique known in the art.

Figure 3C:
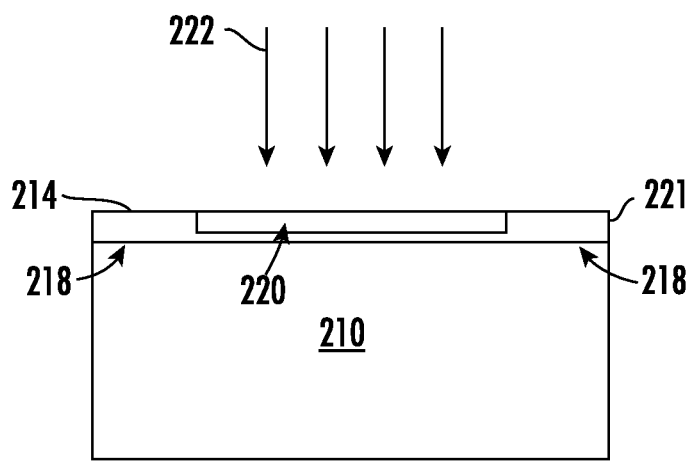

Referring to FIG. 3C and block 320 in FIG. 4, a second ion implantation process may be performed on the semiconductor substrate 210, wherein an ion beam 222 formed of an ionized second dopant species may be directed at the top surface 214 of the substrate 210. Since the mask 216 has been removed from the substrate 210, the ion beam 222 may impinge upon an entirety of the top surface 214 of the substrate 210, including the implanted portion 220 and the unimplanted portion 218. The second ion implantation process may thus also be referred to as a "blanket implant," and the region of the substrate 210 implanted by the second ion implantation process may be referred to as "the blanket implant region 221." The dopant species used in the second ion implantation process may be selected to increase or decrease the susceptibility of the substrate 210 to oxidation. For example, to decrease the susceptibility of the substrate 210 to oxidation, the dopant species selected for the second ion implantation species may be nitrogen. Conversely, to increase the susceptibility of the substrate 210 to oxidation, the dopant species selected for the second ion implantation species may be one of antimony, phosphorus, tin, argon, or fluorine. The present disclosure is not limited in this regard.

The magnitude of the effect of the second ion implantation process on the retardation or enhancement of the oxidation rate of the substrate 210 may be controlled by varying the dose and/or the implant energy of the second ion implantation process. A greater dose and/or implant energy may result in greater retardation or enhancement of the oxidation rate, and a lesser dose and/or implant energy may result in lesser retardation or enhancement of the oxidation rate. The particular dopant species used in the second ion implantation process and the energy and dose of the second ion implantation process may be selected to effect (i.e., increase or decrease) the oxidation rate of the substrate 210 in a manner dominating the effect of the first ion implantation process on the oxidation rate of the substrate. Said another way, the effect of the second ion implantation process on the susceptibility of the substrate to oxidation may be so strong as to nullify or make insignificant the effect of the first ion implantation process on the susceptibility of the substrate to oxidation. Thus, second ion implantation process may provide the blanket implant region 221, including the implanted portion 220 and the unimplanted portion 218, with a uniform or nearly uniform rate of oxidation.

Figure 3D:
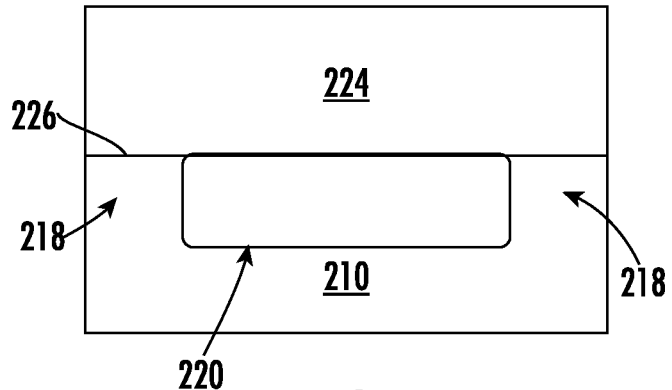

Referring to FIG. 3D and block 330 in FIG. 4, a thermal oxidation process may be performed on the substrate 210, wherein a layer of oxide 224 (e.g., $SiO_2$) is formed atop the substrate 210 and wherein the implanted dopant species in the implanted portion 220 of the substrate 210 is diffused and segregated into the substrate 210. The thermal oxidation process may be wet (using water as a reactant) or dry (using dry oxygen as a reactant). The present disclosure is not limited in this regard. Owing to the second ion implantation process described above, wherein the oxidation rate of the blanket implant region 221 (see FIG. 3C) was made uniform or nearly uniform, the layer of oxide 224 may grow at a generally uniform rate and may have a generally uniform thickness and uniform height across the substrate 210. Particularly, the layer of oxide 224 may have a generally planar floor 26 extending across the implanted portion 220 and the unimplanted portion 218.

Figure 3E:
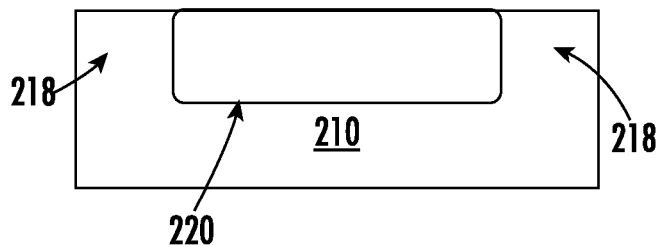

Referring to FIG. 3E and block 240 in FIG. 4, the layer of oxide 224 may be removed from the substrate 210. This may be accomplished via wet etching, dissolving using an acid solution (e.g., dilute hydrofluoric acid solution), or any other suitable technique known in the art. The present disclosure is not limited in this regard. Since the layer of oxide 224 has a uniform thickness and generally planar floor 226 (see FIG. 3D) as described above, removal of the layer of oxide 224 may leave the substrate 210 with a generally uniform, planar surface devoid of trenches, cavities, undulations, or significant unevenness.

Figure 3F:
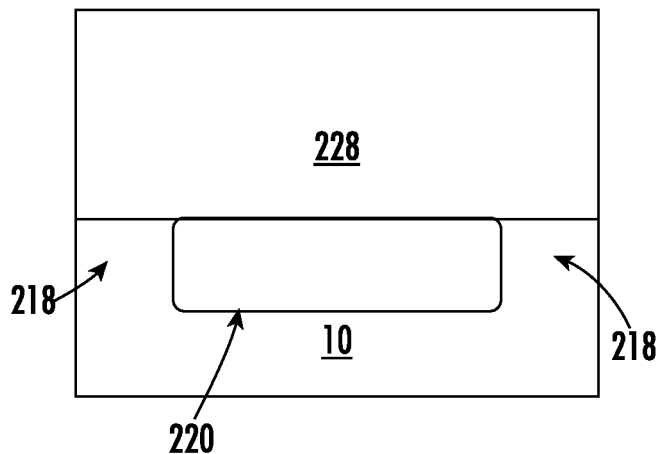

Referring to FIG. 3F and block 250 in FIG. 4, an epitaxial layer 228 may be deposited on the substrate 210 and may cover both the implanted portion 220 and the unimplanted portion 218. In various embodiments, the epitaxial layer 228 may be applied via chemical vapor deposition and may provide the substrate 210 with a crystalline overlayer having a well-defined orientation relative to the crystalline structure of the substrate 210. Since the substrate 210 has a generally planar surface as described above, the deposited epitaxial layer 228 may have a generally uniform thickness, a generally uniform height, and a generally planar top surface.

The above-described method may provide numerous benefits in the art. For example, the above-described method may produce a semiconductor substrate with enhanced surface evenness and uniformity. Additionally, the method may result in fewer downstream process integration issues, such as overlay errors and defects or dislocations in the epitaxial layer 228, relative to processes using conventional implantation and oxidation techniques. The performance and reliability of resulting semiconductor devices may thus be improved.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, while the present disclosure has been described herein in the context of a particular implementation in a particular environment for a particular purpose, those of ordinary skill in the art will recognize its usefulness is not limited thereto. Embodiments of the present disclosure may be beneficially implemented in any number of environments for any number of purposes. Accordingly, the claims set forth below shall be construed in view of the full breadth and spirit of the present disclosure as described herein.

The invention claimed is:

1. A method of processing a semiconductor substrate, the method comprising:
    performing a first ion implantation process on the semiconductor substrate, wherein a first ion beam formed of an ionized first dopant species is directed at a top surface of the semiconductor substrate and wherein a mask disposed on the top surface shields a first portion of the semiconductor substrate from the first ion beam while allowing the first ion beam to impinge upon and implant a second portion of the semiconductor substrate;
    performing a second ion implantation process on the semiconductor substrate, wherein a second ion beam formed of an ionized second dopant species is directed at the top surface of the semiconductor substrate and wherein the mask shields the first portion of the semiconductor substrate from the second ion beam while allowing the second ion beam to impinge upon and implant the second portion of the semiconductor substrate, wherein an effect of the second ion implantation process on an oxidation rate of the second portion counteracts an effect of the first ion implantation process on the oxidation rate of the second portion;
    removing the mask from the top surface of the semiconductor substrate;
    performing an oxidation process on the semiconductor substrate, wherein a layer of oxide having a uniform thickness and uniform height is formed on the first and second portions of the semiconductor substrate;
    removing the layer of oxide from the semiconductor substrate, whereafter the semiconductor substrate is left with a planar surface extending across the first and second portions of the semiconductor substrate; and forming an epitaxial layer on the semiconductor substrate, wherein the epitaxial layer has a uniform thickness and uniform height extending across the first and second portions of the semiconductor substrate.

2. The method of claim 1, wherein the first dopant species is one of antimony, phosphorus, tin, argon, and fluorine and wherein the second dopant species is nitrogen.

3. The method of claim 1, wherein the first dopant species is nitrogen and wherein the second dopant species is one of antimony, phosphorus, tin, argon, and fluorine.

4. The method of claim 1, wherein the oxidation process is a thermal oxidation process.

5. The method of claim 1, wherein at least one of a dose and an energy of the second ion implantation process is varied based on the effect of the first ion implantation process on the oxidation rate of the second portion.

6. A method of processing a semiconductor substrate, the method comprising:
   performing a first ion implantation process on the semiconductor substrate, wherein a first ion beam formed of an ionized first dopant species is directed at a top surface of the semiconductor substrate and wherein a mask disposed on the top surface shields a first portion of the semiconductor substrate from the first ion beam while allowing the first ion beam to impinge upon and implant a second portion of the semiconductor substrate;
   removing the mask from the top surface of the semiconductor substrate;
   performing a second ion implantation process on the semiconductor substrate, wherein a second ion beam formed of an ionized second dopant species is directed at the top surface of the semiconductor substrate, including the first portion and the second portion, wherein an effect of the second ion implantation process on an oxidation rate of the second portion counteracts an effect of the first ion implantation process on the oxidation rate of the second portion;
   performing an oxidation process on the semiconductor substrate, wherein a layer of oxide having a uniform thickness and uniform height is formed on the first and second portions of the semiconductor substrate;
   removing the layer of oxide from the semiconductor substrate, whereafter the semiconductor substrate is left with a planar surface extending across the first and second portions of the semiconductor substrate; and
   forming an epitaxial layer on the semiconductor substrate, wherein the epitaxial layer has a uniform thickness and uniform height extending across the first and second portions of the semiconductor substrate.

7. The method of claim 6, wherein the first dopant species is one of antimony, phosphorus, tin, argon, and fluorine and wherein the second dopant species is nitrogen.

8. The method of claim 6, wherein the first dopant species is nitrogen and wherein the second dopant species is one of antimony, phosphorus, tin, argon, and fluorine.

9. The method of claim 6, wherein at least one of a dose and an energy of the second ion implantation process is varied based on the effect of the first ion implantation process on the oxidation rate of the second portion.

10. A method of processing a semiconductor substrate, the method comprising:
    performing a first ion implantation process on the semiconductor substrate, wherein a first ion beam formed of an ionized first dopant species is directed at a top surface of the semiconductor substrate and wherein a mask disposed on the top surface shields a first portion of the semiconductor substrate from the first ion beam while allowing the first ion beam to impinge upon and implant a second portion of the semiconductor substrate;
    performing a second ion implantation process on the semiconductor substrate, wherein a second ion beam formed of an ionized second dopant species is directed at the top surface of the semiconductor substrate and wherein an effect of the second ion implantation process on an oxidation rate of the semiconductor substrate dominates an effect of the first ion implantation process on the oxidation rate of the semiconductor substrate;
    performing an oxidation process on the semiconductor substrate, wherein a layer of oxide having a uniform thickness and uniform height is formed on the semiconductor substrate;
    removing the layer of oxide from the semiconductor substrate, whereafter the semiconductor substrate is left with a planar surface; and
    forming an epitaxial layer on the semiconductor substrate, wherein the epitaxial layer has a uniform thickness and uniform height extending across the semiconductor substrate.

11. The method of claim 10, wherein the second dopant species is selected to increase an oxidation rate of the semiconductor substrate and is selected from one of antimony, phosphorus, tin, argon, and fluorine.

12. The method of claim 10, wherein the second dopant species is selected to decrease an oxidation rate of the semiconductor substrate and comprises nitrogen.

* * * * *